United States Patent
Monroe et al.

(10) Patent No.: US 8,239,818 B1
(45) Date of Patent: Aug. 7, 2012

(54) DATA STRUCTURE FOR DESCRIBING MBIST ARCHITECTURE

(75) Inventors: Craig M. Monroe, South Burlington, VT (US); Michael R. Ouellette, Westford, VT (US); Douglas E. Sprague, Ellsworth, ME (US); Georgy S. Varghese, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/080,055

(22) Filed: Apr. 5, 2011

(51) Int. Cl.
*G06F 17/50* (2006.01)

(52) U.S. Cl. ........ 716/138; 716/100; 716/101; 716/102; 716/103; 716/104; 716/106; 716/107; 716/110; 716/111; 716/136; 714/718; 714/733; 714/734

(58) Field of Classification Search .......... 716/100–104, 716/106–107, 110–111, 136, 138; 714/718, 714/733, 734
See application file for complete search history.

(56) References Cited

U.S. PATENT DOCUMENTS

| | | | |
|---|---|---|---|
| 6,456,961 B1 | 9/2002 | Patil et al. | |
| 6,560,740 B1 | 5/2003 | Zuraski, Jr. et al. | |
| 6,671,843 B1 | 12/2003 | Kebichi et al. | |
| 7,284,166 B2 | 10/2007 | Zappa et al. | |
| 7,360,134 B1 | 4/2008 | Jacobson et al. | |
| 7,434,131 B2 | 10/2008 | Mukherjee et al. | |
| 7,603,603 B2 | 10/2009 | Dubey | |
| 2002/0194558 A1* | 12/2002 | Wang et al. | 714/718 |
| 2005/0273683 A1* | 12/2005 | Cote et al. | 714/726 |

* cited by examiner

*Primary Examiner* — Nghia Doan
(74) *Attorney, Agent, or Firm* — Hoffman Warnick LLC; David A. Cain

(57) ABSTRACT

A system and associated data structure that can be utilized within a chip design platform to define the structure of an MBIST architecture. A system for generating a memory built in self test (MBIST) design file in described, including a tool for processing an organization file (Org File), wherein the Org File includes lines of code that dictate a structure of the MBIST design file and conform to a data structure defined by the tool; wherein said data structure provides an infrastructure to describe: associations between MBIST components at a design level; associations between MBIST components and hierarchical test ports at the design level; and a serial order of daisy chains among MBIST components within the design level.

12 Claims, 12 Drawing Sheets

| Hierarchical Instance Name (Relative to current block) | Clock Source Instances/Pin and Phase (+/-) | Parameter Values |
|---|---|---|
| FC1 | . | |
| FC2 | . | |
| BC1 | . | |
| W11_1_BIST1D | . | WRAPPER_NUM_BAYS=5 |
| W11_2 | . | |
| W12_1_BIST2R | . | |
| W12_1 | . | |
| W12_2 | . | |
| W21_1_BIST1S | . | |
| W21_1 | . | |
| W21_2 | . | |
| W22_1_BIST3P | . | |
| W22_1 | . | |
| W22_2 | . | |
| W31_1_BIST2R | . | |
| W31_1 | . | |
| W31_2 | . | |
| W32_1_BIST4P | . | |
| W32_1 | . | |
| W32_2 | . | |

```
# Org file - Chip_Top

# Element / Cell Name
# (plus prefix tokens)

top_ref=Chip_Top
ctrlid WRAP_CC_ECID_T09
fctrl WRAP_FUSECNTL_T09
bcntl BISTCNTLT09
    bist BIST1D
        mem WRAP_SRAM1DWxxxxByyyOddss
        mem WRAP_SRAM1DWxxxxByyyOddss
    bist BIST2R
        mem WRAP_SRAM2RWxxxxByyyOddss
        mem WRAP_SRAM2RWxxxxByyyOddss
    bist BIST1S
        mem WRAP_SRAM1SWxxxxByyyOddss
        mem WRAP_SRAM1SWxxxxByyyOddss
    bist BIST3P
        mem WRAP_SRAM3PWxxxxByyyOddss
        mem WRAP_SRAM3PWxxxxByyyOddss
    bist BIST2R
        mem WRAP_SRAM2RWxxxxByyyOddss
        mem WRAP_SRAM2RWxxxxByyyOddss
    bist BIST4P
        mem WRAP_SRAM4PWxxxxByyyOddss
        mem WRAP_SRAM4PWxxxxByyyOddss
end_top_ref
```

Figure 3

| Hierarchical Instance Name (Relative to current block) | Clock Source Instance/Pin and Phase (+/-) | Parameter Values |
|---|---|---|
| FC1 | | |
| FC2 | | |
| BC1 | | |
| W11_1_BIST1D | | WRAPPER_NUM_BAYS=3 |
| W11_1 | | |
| W11_2 | | |
| W12_1_BIST2R | | |
| W12_1 | | |
| W12_2 | | |
| BC2 | | |
| W21_1_BIST1S | | |
| W21_1 | | |
| W21_2 | | |
| W22_1_BIST3P | | |
| W22_1 | | |
| W22_2 | | |
| FC3 | | |
| BC3 | | |
| W31_1_BIST2R | | WRAPPER_NUM_BAYS=2 |
| W31_1 | | |
| W31_2 | | |
| 32_1_BIST4P | | |
| W32_1 | | |
| W32_2 | | |

Figure 5

```
# Org file - Chip_Top
# # Element / Cell Name
# (plus prefix tokens)

top_ref=Chip_Top
coreid WRAP_CC_ECID_T09
fcntl WRAP_FUSECNTL_T09
  bcntl BISTCNTL T09
    bist BIST1D
      mem WRAP_SRAM1DWxxxxxByyyDddss
      mem WRAP_SRAM1DWxxxxxByyyDddss
    bist BIST2R
      mem WRAP_SRAM2RWxxxxxByyyDddss
      mem WRAP_SRAM2RWxxxxxByyyDddss
  bcntl BISTCNTL T09
    bist BIST1S
      mem WRAP_SRAM1SWxxxxxByyyDddss
      mem WRAP_SRAM1SWxxxxxByyyDddss
    bist BIST3P
      mem WRAP_SRAM3PWxxxxxByyyDddss
      mem WRAP_SRAM3PWxxxxxByyyDddss
fcntl WRAP_FUSECNTL_T09
  bcntl BISTCNTL T09
    bist BIST2R
      mem WRAP_SRAM2RWxxxxxByyyDddss
      mem WRAP_SRAM2RWxxxxxByyyDddss
    bist BIST4P                                 w
      mem WRAP_SRAM4PWxxxxxByyyDddss
      mem WRAP_SRAM4PWxxxxxByyyDddss
end_top_ref
```

```
# Orig file - Chip_Top

# Element / Cell Name
# (plus prefix tokens)

top_ref=Chip_Top
ccecid WRAP_CC_ECID_T09
fcntl WRAP_FUSECNTL_T09
    bcntl BISTCNTLT09
        bist BIST2R
            mem WRAP_SRAM2RWxxxxxByyyDddss
            mem WRAP_SRAM2RWxxxxByyyDddss
        bist BIST4P
            mem WRAP_SRAM4PWxxxxByyyDddss
            mem WRAP_SRAM4PWxxxxByyyDddss
fcntl WRAP_FUSECNTL_T09
    bcntl BISTCNTLT09
        bist BIST1S
            mem WRAP_SRAM1SWxxxxByyyDddss
            mem WRAP_SRAM1SWxxxxByyyDddss
        bist BIST3P
            mem WRAP_SRAM3PWxxxxByyyDddss
            mem WRAP_SRAM3PWxxxxByyyDddss
    bcntl BISTCNTLT09
        bist BIST1D
            mem WRAP_SRAM1DWxxxxByyyDddss
            mem WRAP_SRAM1DWxxxxByyyDddss
        bist BIST2R
            mem WRAP_SRAM2RWxxxxByyyDddss
            mem WRAP_SRAM2RWxxxxByyyDddss
end_bp_ref
```

| Hierarchical Instance Name (Relative to current block) | Clock Source Instance:Pin and Phase (+/-) | Parameter Values |
|---|---|---|
| FC1 | | |
| FC3 | | |
| BC3 | | |
| W31_1_BIST2R | , | WRAPPER_NUM_BAYS=2 |
| W31_1 | , | |
| W31_2 | , | |
| W32_1_BIST4P | , | |
| W32_1 | , | |
| W32_2 | , | |
| FC2 | , | |
| BC2 | , | |
| W21_1_BIST1S | , | WRAPPER_NUM_BAYS=3 |
| W21_1 | , | |
| W21_2 | , | |
| W22_1_BIST3P | , | |
| W22_1 | , | |
| W22_2 | , | |
| BC1 | , | |
| W11_1_BIST1D | , | |
| W11_1 | , | |
| W11_2 | , | |
| W12_1_BIST2R | , | |
| W12_1 | , | |
| W12_2 | | |

Figure 7

| Hierarchical Instance Name (Relative to current block) | Clock Source Instance/Pin and Phase (+/-) | Parameter Values |
|---|---|---|
| BC1 | | |
| W11_1_BIST1D | , | |
| W11_1 | , | |
| W11_2 | , | |
| W12_1_BIST2R | , | |
| W12_1 | , | |
| W12_2 | , | |
| BC2 | | |
| W21_1_BIST1S | , | |
| W21_1 | , | |
| W21_2 | , | |
| W22_1_BIST3P | , | |
| W22_1 | , | |
| W22_2 | , | |

```
# Org file - Fig6-Block1

# Element / Cell Name
# (plus prefix tokens)

hier_ref=Block1
view=WRAP_FUSECNTL_ref1
  bcntl BISTCNTLT09
    bist BIST1D
      mem WRAP_SRAM1DWxxxxByyDddss
      mem WRAP_SRAM1DWxxxxByyDddss
    bist BIST2R
      mem WRAP_SRAM2RWxxxxByyDddss
      mem WRAP_SRAM2RWxxxxByyDddss
end_view
view=WRAP_FUSECNTL_ref2
  bcntl BISTCNTLT09
    bist BIST1S
      mem WRAP_SRAM1SWxxxxByyDddss
      mem WRAP_SRAM1SWxxxxByyDddss
    bist BIST3P
      mem WRAP_SRAM3PWxxxxByyDddss
      mem WRAP_SRAM3PWxxxxByyDddss
end_view
end_hier_ref
```

Figure 9

```
# Org file - Fig6-Block2

# Element / Cell Name
# (plus prefix tokens)

hier_ref=Block2
view=WRAP_CCECID_ref1
fcntl WRAP_FUSECNTL_T09
    bcntl BISTCNTLT09
        bist BIST2R
            mem WRAP_SRAM2RWxxxxByyyOddss
            mem WRAP_SRAM2RWxxxxByyyOddss
        bist BIST4P
            mem WRAP_SRAM4PWxxxxByyyOddss
            mem WRAP_SRAM4PWxxxxByyyOddss
end_view
end_hier_ref
```

| Hierarchical Instance Name (Relative to current block) | Clock Source Instance/Pin and Phase (+/-) | Parameter Values |
|---|---|---|
| FC3 | , | |
| BC3 | , | |
| W31_1_BIST2R | , | IBM_WRAPPER_NUM_BAYS=2 |
| W31_1 | , | |
| W31_2 | , | |
| W32_1_BIST4P | , | |
| W32_1 | , | |
| W32_2 | , | |

Figure 10

```
# Org file - Fig6-Chip_Top

# Element / Cell Name
# (plus prefix tokens)

top_ref=Chip_Top
ccecid WRAP_CC_ECID_T08
fcntl WRAP_FUSECNTL_T08
  ref Block1::WRAP_FUSECNTL_ref1
  ref Block1::WRAP_FUSECNTL_ref2
  ref Block2::WRAP_CCECID_ref1
end_top_ref
```

| Hierarchical Instance Name (Relative to current block) | Clock Source Instance/Pin and Phase (+/-) | Parameter Values |
|---|---|---|
| FC1 | , | IBM_WRAPPER_NUM_BAYS=3 |
| FC2 | , | |
| Inst_A | , | |
| Inst_A | , | |
| Inst_B | , | |

DATA STRUCTURE FOR DESCRIBING MBIST ARCHITECTURE

BACKGROUND

The present invention relates to implementing Memory Built-In Self Test (MBIST) architectures, and more particularly to a data structure that can be inputted into a design tool for describing a specific arrangement of an MBIST architecture.

Integrated circuit (IC) chips are typically designed within a software platform, e.g., using a register transfer language (RTL) tool. Along with laying out the functional components of the chip, an MBIST architecture arrangement must also be incorporated into the design to provide Design For Test (DFT) capabilities. As chip designs become increasingly more complex, MBIST architectures likewise need to evolve.

The MBIST architectural arrangement may often be driven by the needs of a particular customer. For instance, a customer may define which memories will share a given MBIST engine. For system test partitioning, especially related to the use of voltage islands, the customer may decide to partition the embedded memories into multiple MBIST partitions, in which case they must also define which memories will belong to each memory BIST partition. The customer may also decide, in the case of multiple voltage islands, to divide the memories into multiple fuse partitions.

It is, therefore, becoming increasingly more important to offer methods to help a customer streamline the DFT insertion of MBIST blocks into a design to provide the customer's desired MBIST architectural arrangement.

BRIEF SUMMARY

Disclosed is a system and data structure that can be utilized within a chip design platform to define the structure, for a particular arrangement, of an MBIST architecture. In a first aspect, the invention provides a data structure, wherein said data structure is used to describe a specific arrangement for a memory built-in self-test (MBIST) architecture at a (e.g., customer specified) design level, and wherein said specific arrangement is coded into a MBIST Organization File (Org File), such that the content of said Org File conforms to said data structure, wherein said data structure provides a means to describe: associations between MBIST components at said design level, associations between MBIST components and hierarchical test ports of said design level, associations between MBIST components at said design level and test ports of hierarchically designed modules (e.g., as specified by the customer) contained within said design level, in which MBIST components and test ports already exist within said hierarchically designed modules, associations between design hierarchy test ports at said design level and test ports of hierarchically designed modules contained within said design level, in which MBIST components and test ports already exist within said hierarchically designed modules, a serial order of daisy chains, wherein said daisy chains may traverse: MBIST components within said design level, and hierarchical boundaries of said hierarchically designed modules contained within said design level, such that said specific arrangement of a desired MBIST architecture organization for a design level is completely described with specific coding of said data structure into said Org File.

In a second aspect, the invention provides a system for generating a memory built in self test (MBIST) design file, comprising: a tool for processing an organization file (Org File), wherein the Org File includes lines of code that dictate a structure of the MBIST design file and conform to a data structure defined by the tool; wherein said data structure provides an infrastructure to describe: associations between MBIST components at a design level; associations between MBIST components and hierarchical test ports at the design level; and a serial order of daisy chains among MBIST components within the design level.

In a third aspect, the invention provides a program product stored on a computer readable storage medium for generating a memory built in self test (MBIST) design file when processed by a design tool, comprising: program code for implementing an organization file (Org File), wherein the Org File encodes a structure of the MBIST design file and conforms to a data structure defined by the design tool; wherein said data structure provides an infrastructure to describe: associations between MBIST components at a design level; associations between MBIST components and hierarchical test ports at the design level; and a serial order of daisy chains among MBIST components within the design level.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings.

FIG. 3 depicts an Org File for describing the specific arrangement of the MBIST architecture of FIG. 2 in accordance with an embodiment of the present invention.

FIG. 5 depicts an Org File for describing the alternative specific arrangement of the MBIST architecture of FIG. 4 in accordance with an embodiment of the present invention.

FIG. 7 depicts an Org File for describing the second alternative specific arrangement of the MBIST architecture of FIG. 6 in accordance with an embodiment of the present invention.

FIG. 9 depicts an Org File for describing a first block of the third alternative specific arrangement of the MBIST architecture of FIG. 8 in accordance with an embodiment of the present invention.

FIG. 10 depicts an Org File for describing a second block of the third alternative specific arrangement of the MBIST architecture of FIG. 8 in accordance with an embodiment of the present invention.

FIG. 11 depicts Org File for describing a top level of the third alternative specific arrangement of the MBIST architecture of FIG. 8 in accordance with an embodiment of the present invention.

Figure 1:
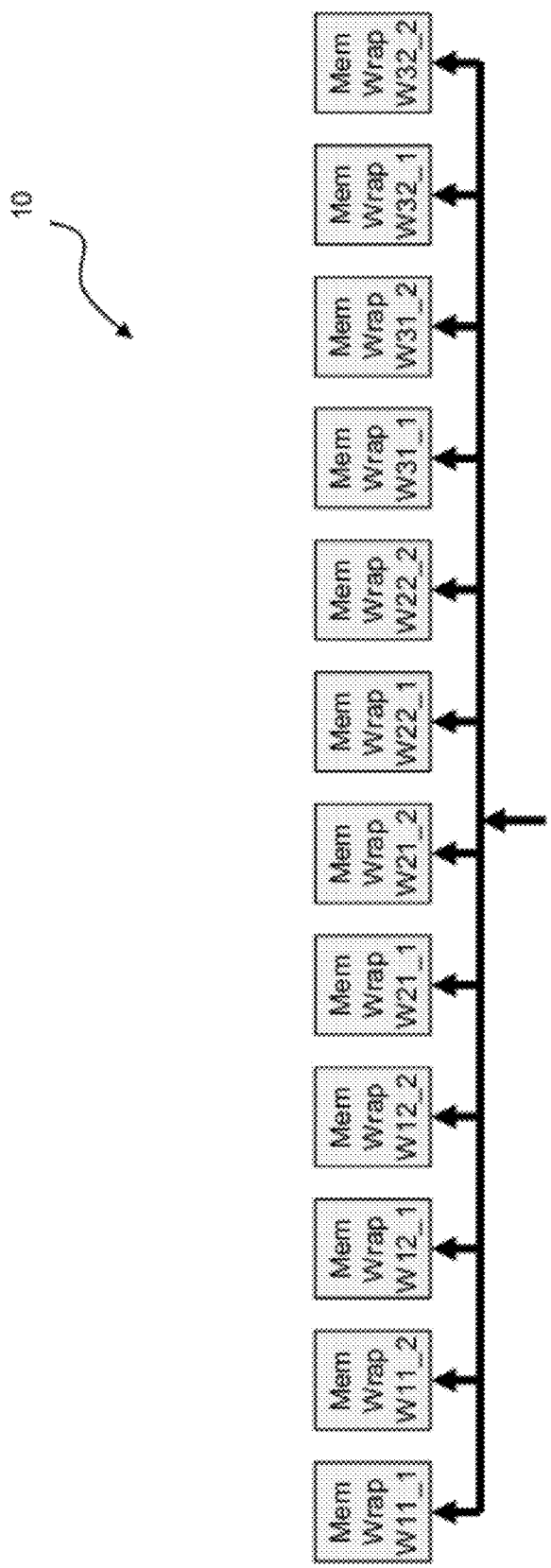
FIG. 1 depicts a memory configuration within a customers RTL or gate-level netlist design, in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like reference numbering represents like elements.

DETAILED DESCRIPTION

Described herein is a system and associated data structure that allows a designer to easily describe a particular memory BIST (MBIST) architectural arrangement. Namely, the system allows the designer to input an organization file (Org File) that conforms to the data structure, in which the Org File is utilized to describe a desired MBIST arrangement. The Org File can be read in and parsed by a software tool that then outputs a "Design File" that will be used by a vendor software tool to perform an actual DFT insertion, into the customer's RTL or synthesized gate-level netlist, of the specified MBIST intellectual property (IP) components and perform the interconnections of the various MBIST IP necessary to implement the designer's desired MBIST architecture arrangement. This DFT insertion may take place in either the RTL version (pre-synthesis) or gate-level netlist version (post-synthesis) of the design.

For the purposes of this disclosure the term "customer" refers to any entity for which an MBIST arrangement and/or chip is being designed. In a common situation, this process may be done by an ASIC vendor for a third party. However, it is understood that a customer may also comprise a separate group within a common company.

Also, for the purposes of this disclosure, terms "MBIST architecture," "MBIST arrangement," "MBIST architectural arrangement," and "MBIST and Repair architecture" are to be considered synonymous and may be used interchangeably throughout this description. It should be also noted that the use of the word "hierarchy" is utilized in two separate contexts, namely, the MBIST architectural hierarchy as well as a customer's design hierarchy. The MBIST architectural hierarchy refers to the parent-child or sibling relationships between the various BIST IP components of the MBIST architecture. Design hierarchy implies the notion of the customer constructing their chip logic design as separate design blocks, and then integrating these separate design blocks into higher level design blocks (i.e., design hierarchy), until finally all of these blocks are represented in the overall chip design. For purposes of clarity, the terms "MBIST architectural hierarchy" and "design hierarchy" are used to describe separate concepts that are readily understood by one well-versed in the field of semiconductor logic design or design-for-test thereof.

Figure 2:
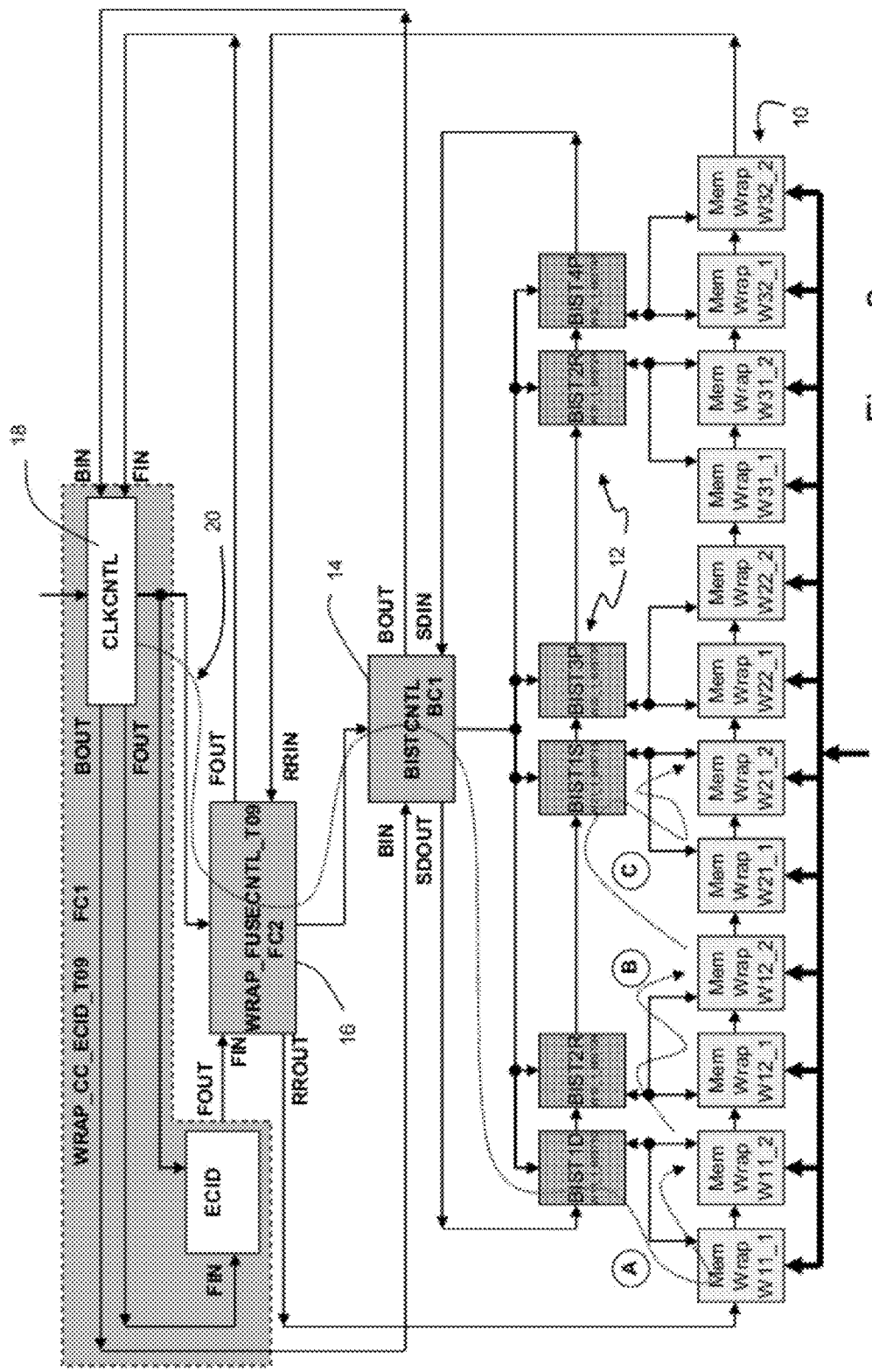
FIG. 2 depicts a design having a specific arrangement of the MBIST architecture for the memory configuration of FIG. 1 in accordance with an embodiment of the present invention.

FIG. 1 depicts a design layer having a plurality of memory elements 10 prior to memory BIST insertion, and FIG. 2 depicts a simple memory BIST architecture arrangement generated by an MBIST insertion software tool, arranged according to a user's preferences. As shown in FIG. 2, the MBIST architecture arrangement includes a hierarchical architecture structure in which the memory elements 10 are located at the bottom; a set of MBIST engines 12 are selectively coupled to and reside above the memory elements 10; a MBIST control 14 is coupled to and resides above the MBIST engines 12; a fuse control 16 is coupled to and resides above the MBIST control 14; and a clock control 18 is coupled to and resides above the fuse control 16. Dotted line 20 shows the flow of control from the clock control 18, through the fuse control 16, through the MBIST control 14, through a MBIST engine 12, and through memory elements 10.

The present approach provides a data structure that allows the end user to describe such a hierarchy using an Org File that can read by an MBIST insertion software tool. FIG. 3 depicts an example Org File for implementing the specific architecture arrangement of FIG. 2. Referring to the Module Names in the third column, notice that the order of the various components in the list corresponds to the memory BIST architecture hierarchy, with the top component (clock control with Hierarchical Instance Name FC1) of the MBIST architecture hierarchy listed first in the list, followed by next highest component (fuse control of Hierarchical Instance Name "FC2") in the MBIST architecture hierarchy listed next, follow by BISTCNTL (bist control) (BC1), and so on, down through the MBIST architecture hierarchy. Here, the use of the term "hierarchical" in the phrase "Hierarchical Instance Name" is actually referring to the location of the referenced component within the customer's "design hierarchy".

At the next level down in the MBIST architecture hierarchy, there are multiple branches, and each branch of the MBIST architecture hierarchy is completely listed, prior to listing the components of the next branch. In this example there are six branches from the BISTCNTL09 to its associated BIST engines. Each BIST engine branch is completely listed (BIST engine and subordinate memory wrappers), before starting to list the next branch of the MBIST architecture hierarchy.

The order of the various components in the list also relates to the positioning of the various components in the various daisy chains. In this example, there are multiple BIST engines associated with BISTCNTL09 (BC1) and they are listed in order of (by hierarchical instance name) W11_1_BIST1D, W12_1_BIST2R, W21_1_BIST1S, W22_1_BIST3P, W31_1_BIST2R, W32_1_BIST4P, which corresponds to the order as they are connected in the BISTCNTL-BIST daisy chain.

The ordering of the list takes into account the MBIST architecture hierarchy, for each complete branch description, with the branch order corresponding to the order of the daisy chain through the component where the branch starts. In the example of FIG. 2, the branches start at the BIST engines, and so the order of the branches corresponds to the order of the BISTs in the BISTCNTL-BIST daisy chain.

Figure 4:
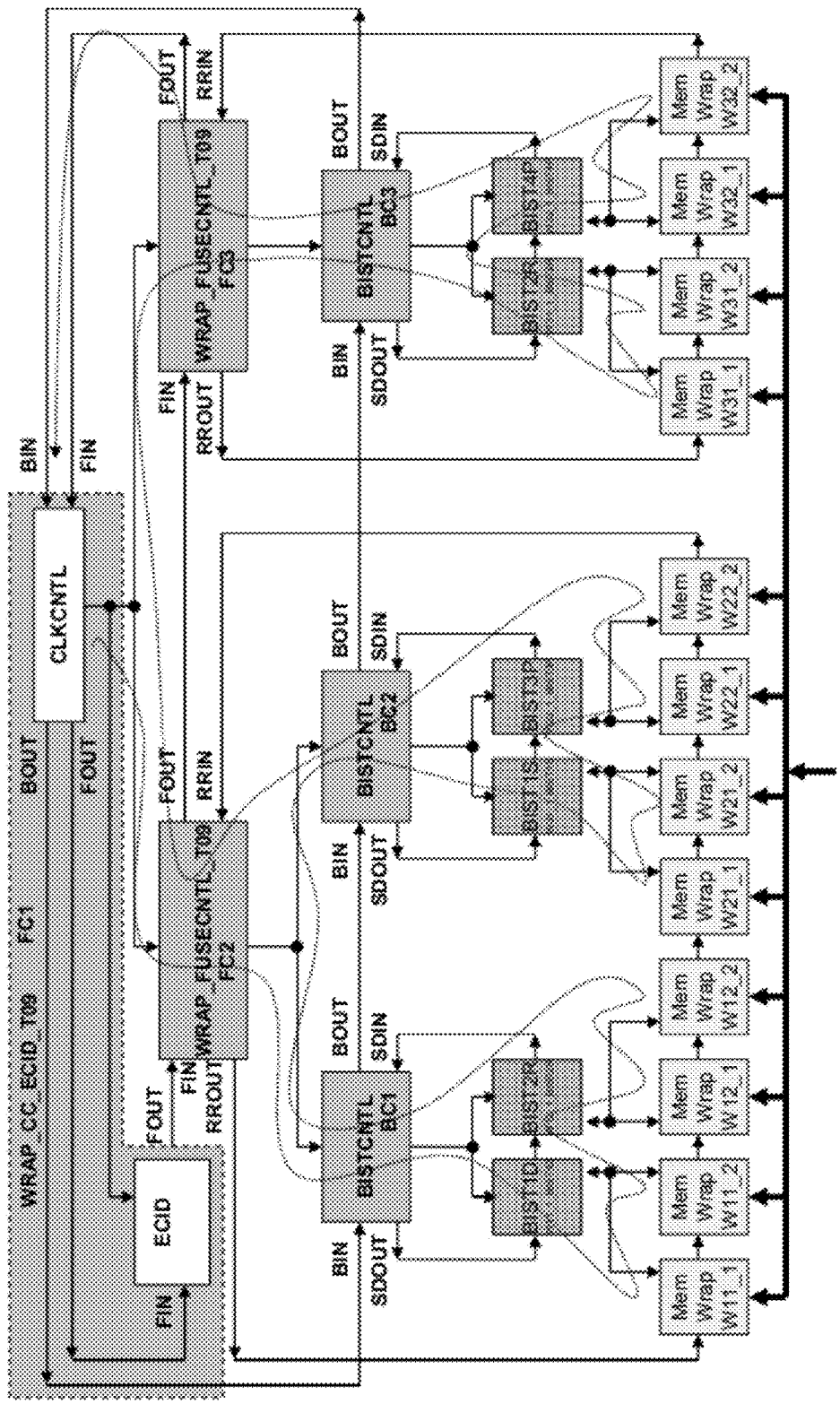
FIG. 4 depicts a design file having an alternative specific arrangement of the MBIST architecture for the memory configuration of FIG. 1 in accordance with an embodiment of the present invention.

FIG. 4 depicts an alternative MBIST architecture arrangement involving the same group of memories. In this case, multiple FUSECNTL (fuse control) domains (FC2 and FC3) and multiple BISTCNTL (bist control) domains (BC1, BC2 and BC3) are implemented. The Org File used to create the hierarchy of FIG. 4 is shown in FIG. 5. Notice that the order of the various components in the list corresponds to the MBIST hierarchy, with the top component of the hierarchy (ccecid—FC1) listed first in the list, followed by next highest component in the hierarchy (fcntl—FC2), which is also next in the WRAP_CC_ECID_T09-WRAP_FUSECNTL_T09 daisy chain, listed next, followed by a complete listing of the various components in FC2's MBIST architecture hierarchy branch, then followed by a complete listing of the components in FC3's (fcntl) MBIST architecture hierarchy branch.

Also notice that at each level of the MBIST architecture hierarchy, all lower branches are exhausted, prior to ascending the hierarchy back to FC2 and then to the next branch starting at FC3. In other words, all sub-components of a BIST IP block are listed, prior to continuing to the next BIST IP (FC3 in this example) in the daisy chain.

As shown in these examples, the Org File order follows the upper-most daisy chain order, descending and tracing through into each lower branch and lower daisy chain, before resuming the trace to the next block in the upper-most daisy chain. This protocol is followed when creating the Org File at every level of the MBIST and Repair architecture.

Figure 6:
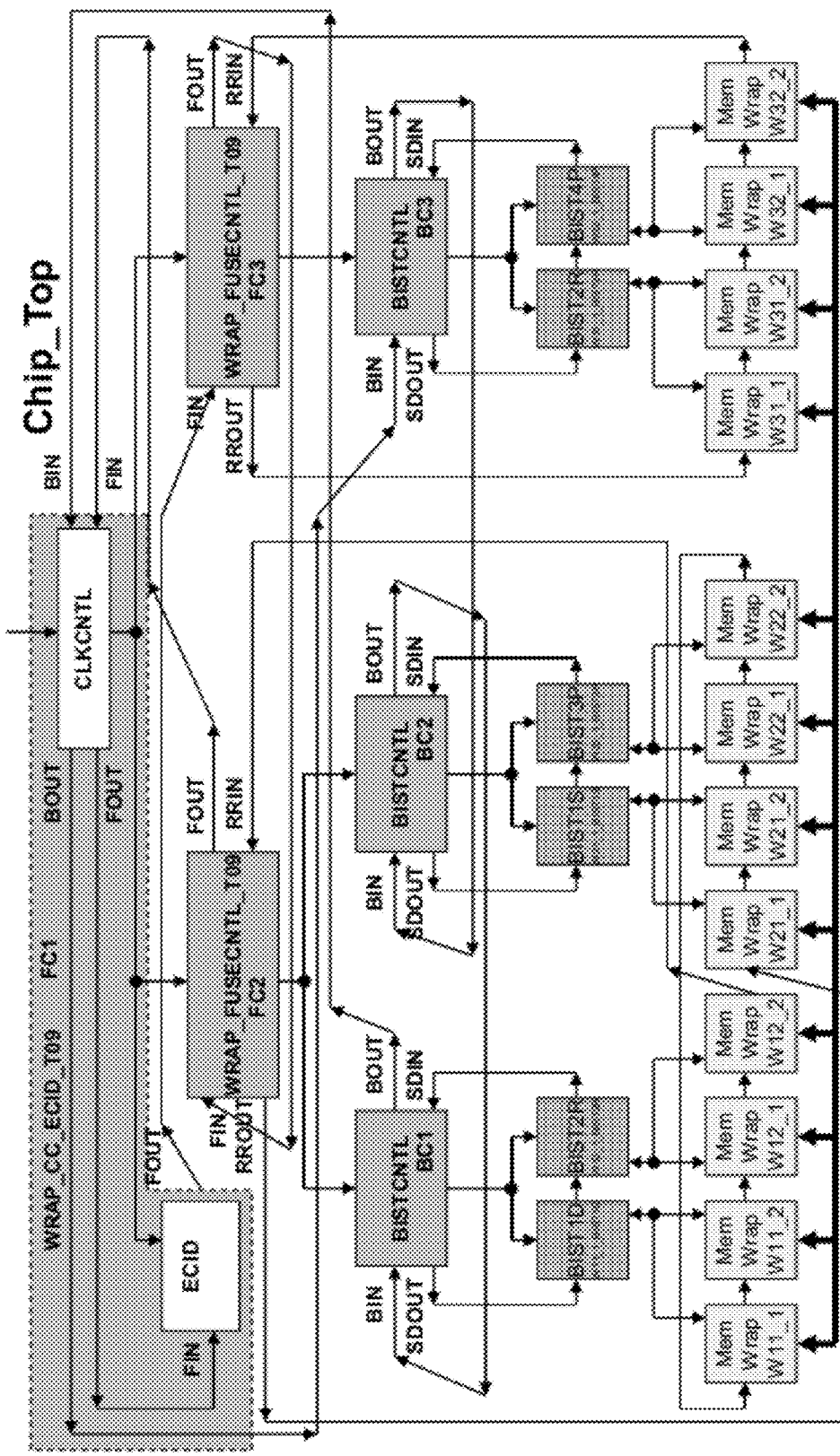
FIG. 6 depicts a design file having a second alternative specific arrangement of the MBIST architecture for the memory configuration of FIG. 1 in accordance with an embodiment of the present invention.

FIG. 6 shows a re-organization of the FUSECNTL and BISTCNTL daisy chains, with the corresponding Org File shown in FIG. 7. First, notice how all of the subordinate BIST IP components and memories, of the branch originating at FC3, are moved, as a complete block of lines, to a position just prior to FC2. Second, notice how all of the subordinate BIST IP components and memories of the branch originating at BC2 are moved, as a complete block of lines, to a position just prior to BC1. Third, notice how the daisy chain order of the memory wrappers (W11_1, W11_2, W12_1, W12_2, W21_1, W21_2, W22_1, W22_2) which are all subordinate to FC2, are also rearranged, as a block (W21_1, W21_2, W22_1, W22_2, W11_1, W11_2, W12_1, W12_2), when moving the entire block of lines for BC2 to a position just prior to BC1.

When moving a FUSECNTL in the list, all of its subordinate components must also move with it. If this does not happen, then the components which are left behind would end up being associated with a different FUSECNTL instance. Coding the Org File must conform to the following rules. A FUSECNTL component must be followed by at least one BISTCNTL. Each BISTCNTL must be followed by at least one BIST engine. Each BIST engine must be followed by at least one memory wrapper. The keywords at the beginning of each line in the Org File are used by the Org File processing software to identify each component as belonging to a certain position in the MBIST architecture hierarchy. As such, these keywords are used by the software to insure that the Org File is being coded in a legal fashion, such that it conforms to what is allowed within the constraints of the MBIST architecture rules.

Figure 8:
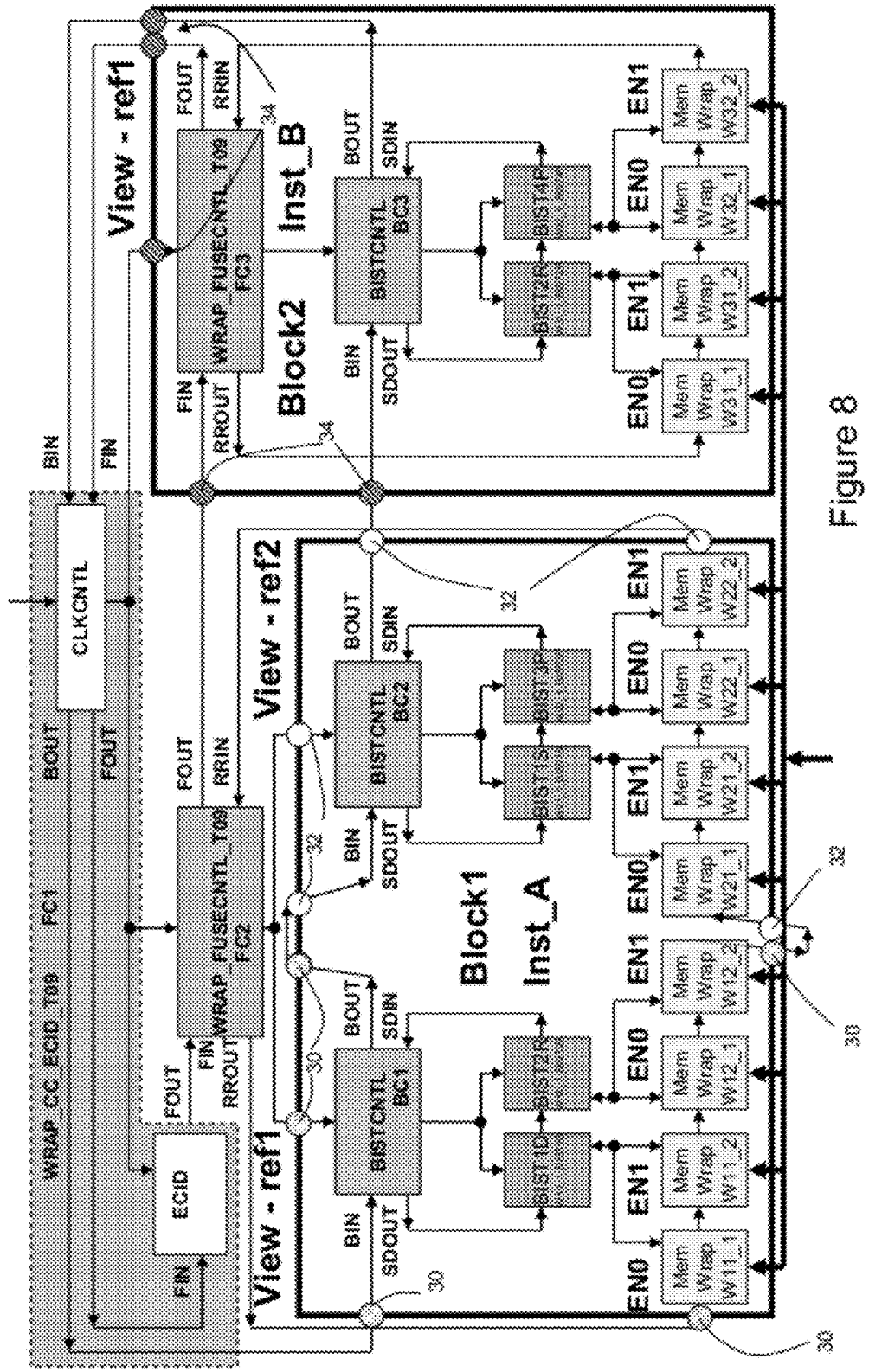
FIG. 8 depicts a design file having a third alternative specific arrangement of the MBIST architecture for the memory configuration of FIG. 1 in accordance with an embodiment of the present invention.

Each of the previous examples are cases where all MBIST components are inserted by running the MBIST insertion software at the top level of the customer's chip design hierarchy. However, the data structure and Org File allow for hierarchical design MBIST insertion, where the MBIST insertion software may be run on lower level blocks of design hierarchy, and then also at the top-level of design hierarchy. FIG. 8 shows a design that places the memories into hierarchical design functional blocks, specifically Block1 and Block2.

In particular, FIG. 8 shows a design hierarchy approach for MBIST insertion, which allows a first designer to insert some of the MBIST architecture arrangement into design hierarchy Block1 and a second designer to insert some of the MBIST architecture arrangement into design hierarchy Block2, and then later, a third designer to insert the rest of the MBIST architecture arrangement at the top design hierarchy level of the chip (Chip_Top).

Note that there is an Org File defined for each block of design hierarchy where MBIST insertion is to be performed, as shown in FIGS. 9-11. In a "bottom-up" hierarchical chip design flow, the designers will run MBIST insertion first on Block1 and Block2, followed by running MBIST insertion on Chip_Top.

In the lower level blocks (Block1 and Block2) shown in FIGS. 9 and 10, the file starts with a "hier_ref=" construct. This construct is used at the beginning of every Org File which represents a block that is not the top level of the chip design, to indicate the beginning of a set of lines that will describe the MBIST arrangement within the current module named after the "hier_ref=" construct. The "end_hier_ref" construct defines the end of the current module's MBIST description.

Within the current module description shown in FIGS. 9 and 10, there is also at least one "view=" construct, followed by some lines and then an "end_view" construct. These two constructs are used to associate the defined MBIST arrangement (defined on the lines within the two constructs) with a set of test ports that are relevant to that particular view type. For example, view=WRAP_FUSECNTL_ref1 refers to a set of test ports associated with a "FUSECNTL view". A "FUSECNTL view" defines the set of test ports that are needed to pass connections from a BISTCNTL block and all of the BISTCNTL block's subordinate BIST IP blocks, within the current module, to a FUSECNTL block that will exist later, at a level of design hierarchy above the current design module.

The set of test ports 30 associated with "view=WRAP_FUSECNTL_ref1" are indicated with dotted circles in FIG. 8. Some of these test ports will actually facilitate connections between a BISTCNTL and a FUSECNTL, while other test ports facilitate connections between the memories (only the memories which are subordinate to that view's associated BISTCNTL) and the FUSECNTL, and other test ports facilitate connections between the view's associated BISTCNTL and a WRAP_CC_ECID_T09.

Note also that there are actually two views of type FUSECNTL associated with Block1. Also note within the Org File for Block1, that there are two sets of "view=/end_view" statements, each one corresponding to the two FUSECNTL views shown in FIG. 8. These two views are made distinguishable from each other by using the "_ref1" and "_ref2" suffixes when naming the two views. The test ports associated with "view=WRAP_FUSECNTL_ref1" are indicated with dotted circles 30 while the test ports associated with "view=WRAP_FUSECNTL_ref2" are indicated with white circles 32. Note that for each FUSECNTL view, that the first component listed under the "view=" statement, is a BISTCNTL.

In the Org File for Block2 there is a CCECID type of view defined through the use of the statement "view=WRAP_CCECID_ref1". The first component listed under the "view=" statement is an instance of a FUSECNTL. The test ports 34 associated with this view are indicated with slashed circles in FIG. 8. In each of the Org Files for Blocks 1 and 2 there are only BIST components and memories listed within the view definitions. This is representative of a lower level BIST-inserted design hierarchy block, alternatively referred to as a BIST-block (a BIST block is a module where BIST insertion has already taken place). For BIST blocks that contain other BIST blocks, the "ref" statement is used to connect a component of view of a current design hierarchy block to a view of a lower level BIST block.

The "ref" construct is used to indicate connections from a component or view of the current design hierarchy module, to test ports associated with a view on a lower level BIST block. In the Org File for Chip_Top in FIG. 11 the list begins with the "top_ref=" construct followed by an instance of a WRAP_CCECID_T09 module, followed by an instance for a WRAP_FUSECNTL_T09 (FC2). After this, three "ref" constructs are listed, such that references are made to the three views of the two lower blocks. The first two "ref" statements are referring to the two FUSECNTL views (_ref1 and _ref2) of Block1. Since these two ref statements refer to a "FUSECNTL" type view, then they are to be associated with the previously listed FUSECNTL, which happens to be FC2. As a result, the test ports of these referenced BIST blocks will be connected to: the previous instance of WRAP_FUSECNTL_T09 (instance FC2) listed in the Org File, or components in the daisy chains which are relevant to FC1.

The position of the first ref statement (1st in the list), "ref block1::WRAP_FUSECNTL_ref1" indicates that all subordinate daisy chain components of the first FUSECNTL view of Inst_A are to be connected first in any relevant daisy chain ordering. The position of the second ref statement (2nd in the list), "ref Block1::WRAP_FUSECNTL_ref2" indicates that all subordinate daisy chain components of the second FUSECNTL view of Inst_A are to be connected next in any relevant daisy chain ordering.

This can be seen in FIG. 8, where the FUSECNTL-memory daisy chain leaves Block1 through a dotted circle 30 (leaves the "WRAP_FUSECNTL_ref1" view) and then re-enters Block1 through a white circle 32 (enters the "WRAP_FUSECNTL_ref2" view).

Notice also that for both of these daisy chains, since the "ref" statement for the "WRAP_CC_ECID_ref1" view of Block 2 appears last in the Org File, Block2 appears last in the relevant daisy chains. In this example, the relevant daisy chains for Block2 are the CCECID-FUSECNTL and the CCECID-BISTCNTL daisy chains.

Figure 12:
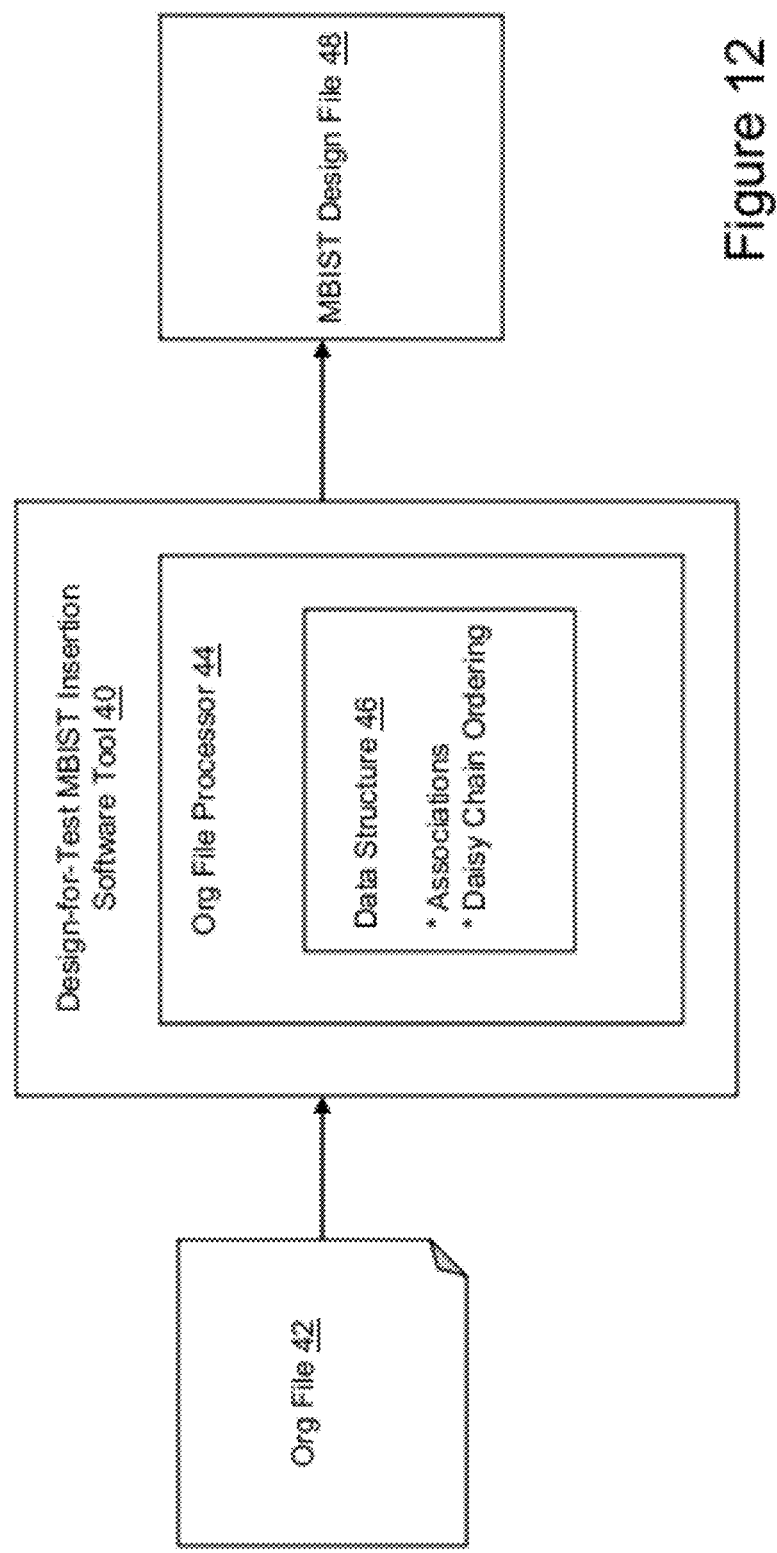
FIG. 12 describes a design-for-test MBIST insertion software tool for processing an Org File and generating a design file in accordance with an embodiment of the present invention.

FIG. 12 depicts an illustrative MBIST insertion software tool 40 having a system that utilizes a data structure 46 to process an Org File 42 to create an MBIST design file 48. As shown, the design-for-test MBIST insertion software tool 40 includes an Org File processor 44 that defines and implements data structure 46. In order to process the Org File 42, the lines of code contained therein must conform to the data structure 46. Data structure 46 provides the necessary infrastructure, as described above, to, e.g.: (1) describe associations between MBIST components at a current design level; (2) describe associations between MBIST components and hierarchical test ports of the current design level; (3) describe associations between MBIST components at a current design level and test ports of hierarchically designed customer modules contained within the current design level, in which MBIST components and test ports have already been added to the hierarchically designed customer modules; (4) describe associations between hierarchical test ports at a current design level and test ports of hierarchically designed customer modules contained within the current design level, in which MBIST components and test ports have already been added to said hierarchically designed customer modules; and (5) describe a serial order of daisy chains, in which the daisy chains may traverse MBIST components within the current design level, and hierarchical boundaries of the hierarchically designed customer modules contained within the current design level, such that the specific arrangement of a desired memory MBIST architecture arrangement or organization, defined by using an Org File, for a certain design level is completely described with specific coding of the data structure into said Org File.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including Instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A data structure,
   wherein said data structure is stored on a non-transitory computer readable storage medium and is used to describe a specific arrangement for a memory built-in self-test (MBIST) architecture at a design level, and wherein said specific arrangement is coded into an MBIST Organization File (Org File), such that content of said Org File conforms to said data structure,
   wherein said data structure provides a means to describe:
       associations between MBIST components at said design level,
       associations between MBIST components and hierarchical test ports of said design level,
       associations between MBIST components at said design level and test ports of hierarchically designed modules contained within said design level, in which MBIST components and test ports already exist within said hierarchically designed modules,
       associations between hierarchical test ports at said design level and test ports of hierarchically designed modules contained within said design level, in which MBIST components and test ports already exist within said hierarchically designed modules,
       a serial order of daisy chains, wherein said daisy chains may traverse: MBIST components within said design level, and hierarchical boundaries of said hierarchically designed modules contained within said design level, such that said specific arrangement of a desired MBIST architecture organization for a design level is completely described with specific coding of said data structure into said Org File.

2. The data structure of claim 1, wherein said design level may comprise a top level of hierarchy for a chip design.

3. The data structure of claim 1, wherein said design level may comprise a lower level hierarchical block within a chip design.

4. The data structure of claim 1, wherein the Org File is readable by a design-for-test MBIST insertion software tool.

5. A system for generating a memory built in self test (MBIST) design file, comprising:
   a tool for processing an organization file (Org File), wherein the Org File includes lines of code that dictate a structure of the MBIST design file and conform to a data structure defined by the tool;
   wherein said data structure provides an infrastructure to describe:
       associations between MBIST components at a design level;
       associations between MBIST components and hierarchical test ports at the design level;
       associations between MBIST components at the design level and test ports of a hierarchically designed module contained within said design level, in which MBIST components and test ports already exist within said hierarchically designed module;
       associations between hierarchical test ports at the design level and test ports of a hierarchically designed module contained within the design level, in which MBIST components and test ports already exist within the hierarchically designed module; and
       a serial order of daisy chains wherein said daisy chains traverse at least one of: MBIST components within said design level, and hierarchical boundaries of said hierarchically designed modules contained within said design level, such that said specific arrangement of a desired MBIST architecture organization for a design level is completely described with specific coding of said data structure into said Org File.

6. The system of claim 5, wherein said design level comprises a top level of hierarchy for a chip design.

7. The system of claim 5, wherein the design level comprises a lower level hierarchical block within a chip design.

8. The system of claim 5, wherein the tool comprises a design-for-test MBIST insertion software tool.

9. A program product stored on a non-transitory computer readable storage medium for generating a memory built in self test (MBIST) design file when processed by a design tool, comprising:

program code for implementing an organization file (Org File), wherein the Org File encodes a structure of the MBIST design file and conforms to a data structure defined by the design tool;

wherein said data structure provides an infrastructure to describe:

associations between MBIST components at a design level;

associations between MBIST components and hierarchical test ports at the design level;

associations between MBIST components at the design level and test ports of a hierarchically designed module contained within said design level, in which MBIST components and test ports already exist within said hierarchically designed module;

associations between hierarchical test ports at the design level and test ports of a hierarchically designed module contained within the design level, in which MBIST components and test ports already exist within the hierarchically designed module; and a serial order of daisy chains wherein said daisy chains traverse at least one of: MBIST components within said design level, and hierarchical boundaries of said hierarchically designed modules contained within said design level, such that said specific arrangement of a desired MBIST architecture organization for a design level is completely described with specific coding of said data structure into said Org File.

10. The program product of claim 9, wherein said design level comprises a top level of hierarchy for a chip design.

11. The program product of claim 9, wherein the design level comprises a lower level hierarchical block within a chip design.

12. The program product of claim 9, wherein the design tool comprises a design-for-test MBIST insertion software tool.

* * * * *